(12) United States Patent
Mukherjee et al.

(10) Patent No.: US 6,480,998 B1
(45) Date of Patent: Nov. 12, 2002

(54) ITERATIVE, NOISE-SENSITIVE METHOD OF ROUTING SEMICONDUCTOR NETS USING A DELAY NOISE THRESHOLD

(75) Inventors: Pradipto Mukherjee, Austin, TX (US); Aurobindo Dasgupta, Austin, TX (US); David T. Blaauw, Austin, TX (US); David R. Bearden, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/551,322

(22) Filed: Apr. 18, 2000

(51) Int. Cl.[7] .............................................. G06F 17/50
(52) U.S. Cl. ................. 716/13; 716/6; 716/12
(58) Field of Search .................. 60/370; 716/1, 716/2, 6, 12, 13; 455/295

(56) References Cited

U.S. PATENT DOCUMENTS 568,395 A * 9/1896 Huang ........................ 60/370
6,278,951 B1 * 8/2001 Sato ........................... 455/295
6,353,917 B1 * 3/2002 Muddu et al. ................. 716/6
6,378,109 B1 * 4/2002 Young et al. .................. 716/2

* cited by examiner

Primary Examiner—Matthew S Smith
Assistant Examiner—Thuan Do

(57) ABSTRACT

The invention relates to a new method of guidance for routing of nets in an integrated circuit model wherein all nets are first approximately routed, as with Steiner routing, and victim nets with functional delay noise above predetermined thresholds are identified. Each victim net is then detail routed. For each victim net detail routed, a set of least noise aggressive neighboring nets is selected. Segments of those neighboring nets are assigned tracks adjacent to the victim net in such a way as to maximize utilization of the victim net's neighboring tracks, thereby reducing noise induced on the victim net and maximizing use of available space on the semiconductor. The process is then repeated until there are no additional victim nets, at which point the remaining nets are detail routed.

18 Claims, 3 Drawing Sheets

ITERATIVE, NOISE-SENSITIVE METHOD OF ROUTING SEMICONDUCTOR NETS USING A DELAY NOISE THRESHOLD

FIELD OF THE INVENTION

The invention relates generally to the field of semiconductor design. and more specifically to a method and apparatus for routing semiconductor nets that considers functional and delay noise during the routing process.

RELATED ART

As semiconductors operate at increasingly low cycle times and geometries become increasingly. small, functional and delay noise become more of a problem. Conventionally, noise or cross talk problems in the microprocessor design process are addressed by a cross talk analysis performed after a global or detailed routing of the nets in the chip. Following detailed routing, however, the chip layout is much less flexible. Consequently, it becomes very difficult to correct functional and delay noise problems identified after detailed routing. In turn, this may result in a longer time-to-market for the product.

It has therefore become desirable to develop a new method and system for routing nets which is noise-sensitive at earlier stages of the design process, as accomplished by the present invention.

BRIEF DESCRIPTION OF THE DRAWINGS

The present invention is illustrated by way of example and not limitation in the accompanying figures, in which like references indicate similar elements, and in which.

DESCRIPTION OF THE PREFERRED EMBODIMENTS

The following discussion is intended to provide a detailed description of at least one embodiment of the invention and should not be taken to be limiting of the invention itself. Rather, any number of variations may fall within the scope of the invention which is properly defined in the claims following this description.

The present invention relates to a novel method for routing semiconductor nets wherein functional noise and delay noise problems are addressed at earlier stages in the design process. All nets in the chip are Steiner routed, capacitance is extracted, and a static timing analysis performed. A list of noise related victim nets is generated which represents potentially problematic nets. The victim nets are detail routed, as are the least noise aggressive neighboring nets, which are selected so as to interact with the victim net in a manner which complies with pre-established noise thresholds. The process is then repeated until there are no new victim nets detected, at which point the remaining nets are detail routed.

Figure 1:
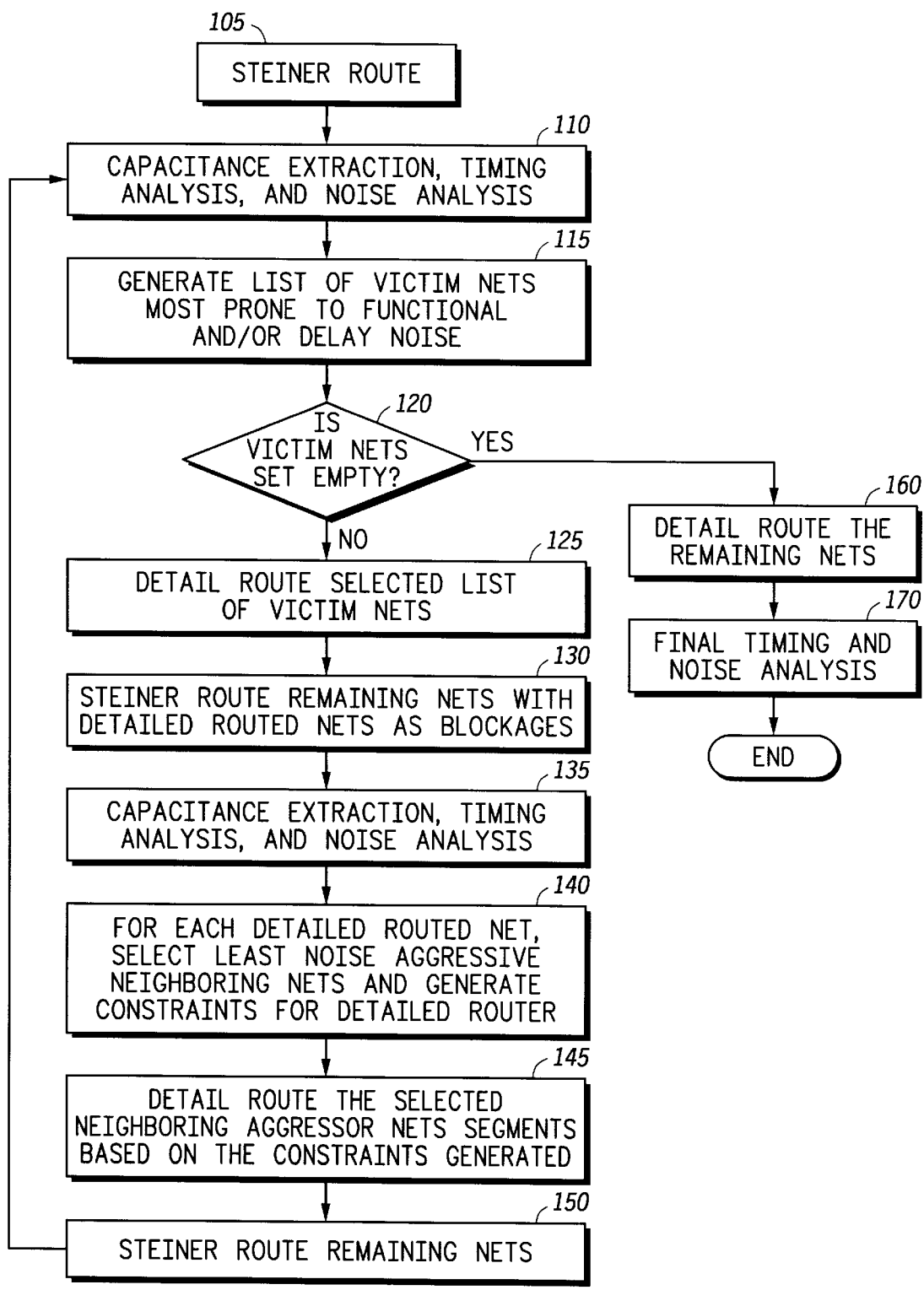
FIG. 1 is a flowchart showing a preferred embodiment of the methodology of routing semiconductor nets of the present invention.

Referring now to FIG. 1, initially all nets are "approximate routed." Approximate routing shall be understood as a process whereby all nets are not detail-routed, but are assigned approximate routes which may not be unique. Approximate routing is much faster than detail routing and retains additional flexibility to the final design. One type of approximate routing is known in the art as "Steiner routing," which shall be discussed in an exemplary fashion as the method of approximate routing herein.

As shown in FIG. 1, all nets are Steiner routed in step 105. As a result of Steiner routing, the nets are assigned approximate tracks which may overlap at various segments. After all nets are Steiner routed, grounded and coupling capacitances are extracted, and timing and noise analyses are performed in step 110. The static timing analysis performed in step 110 typically provides information as to the minimum cycle time for the chip, and generates a worse paths-based slack report.

In step 115, a list of victim nets most prone to functional and/or delay noise is generated. As described in more detail below in connection with FIG. 2, this list of victim nets may be generated through integer linear programming heuristics, or by other means known to those skilled in the art. As shown in step 120, if the set of victim nets is empty, then the remaining nets are detail routed in step 160, and the final timing and noise analysis is performed in step 170. If, however the set of victim sets is not empty, then each of the victim nets identified in step 115 is detailed routed in step 125.

The detailed routing of the victim nets acts as a blockage with respect to the Steiner routes of other non-victim nets. In other words, once detail-routed, the path of the net will not be used in future iterations of the Steiner routing. In this way, the chip is incrementally detail routed, which promotes routing convergence. In step 130, the remaining nets are Steiner routed with the nets which were detail routed in step 125 acting as blockages. In step 135, the chip is again subjected to capacitance extraction, timing analysis and noise analysis.

Still referring to FIG. 1, for each net detail routed in step 125, least noise aggressive of neighboring nets are selected in such a way as to maximize the amount of net segment coverage of tracks adjacent to the victim net in step 140. "Least" noise. aggressive neighboring nets may be those optimal for a set of conditions present in each embodiment, and not optimal in the absolute sense. Step 140 is discussed in greater detail in connection with FIG. 4, below. The purpose of selecting least noise aggressive neighboring nets (or those with noise below predetermined thresholds) is to identify those neighboring nets which may be placed adjacent to the victim net in such as way as to reduce functional and delay noise below specified thresholds. Constraints are generated for the detailed router, which results in routing the segments of the less aggressive neighboring nets are placed adjacent to the victim net in such a way as to fall within the aforementioned functional and delay noise thresholds.

Utilizing the constraints generated in connection with step 140, the selected neighboring aggressor nets are detail routed in step 145. These net segments then become fixed for purposes of the iterative process, and also act as blockages for later Steiner routing. All remaining nets are Steiner routed in step 150, and the process returns to step 110 to be repeated until a "yes" response is obtained in response to decision branch 120.

Figure 2:
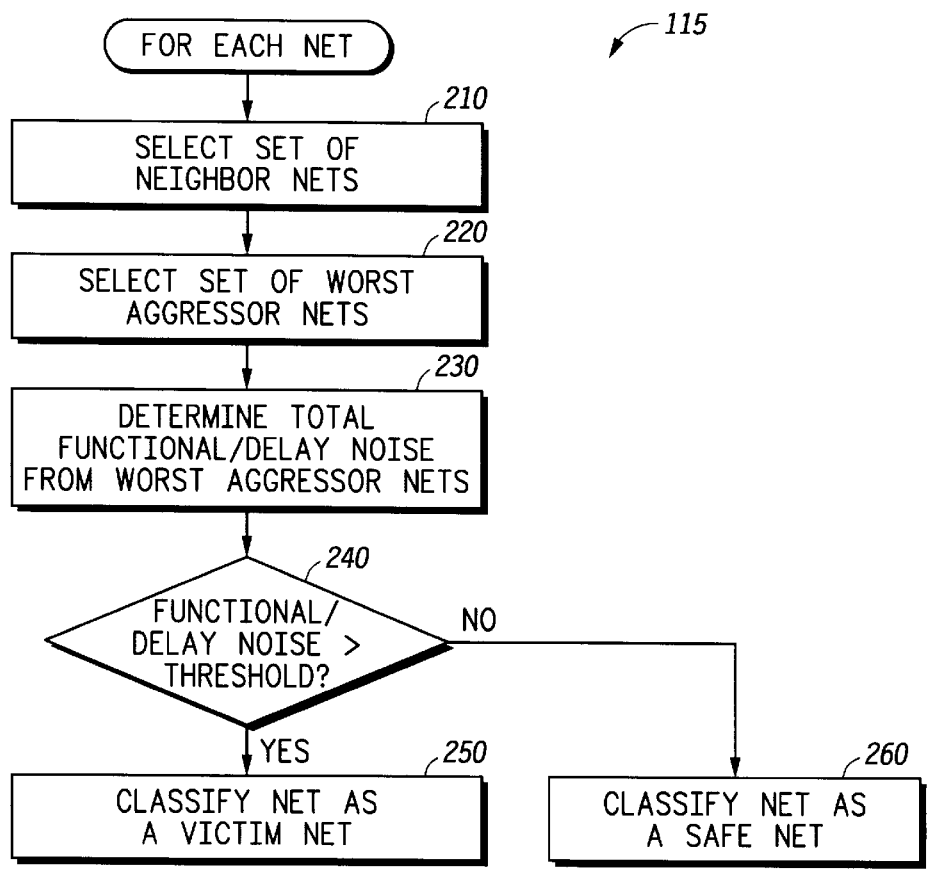
FIG. 2 is a flowchart showing in greater detail the process for classifying victim nets and safe nets, shown as step 115 in FIG. 1.
Figure 3:
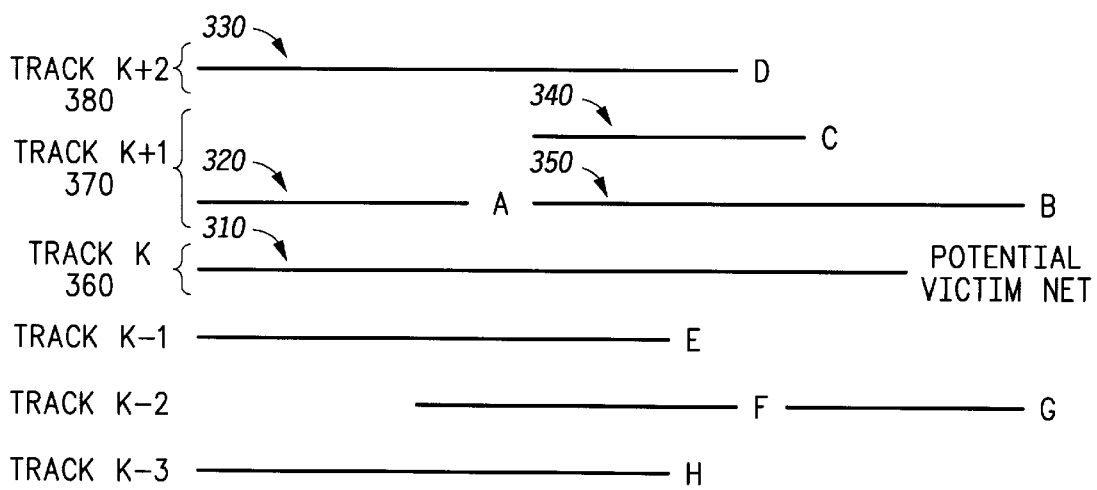
FIG. 3 is an exemplary diagram showing a potential victim net and neighboring aggressor nets.

Step 115 is discussed in more detail in connection with FIG. 2. FIG. 2 shows the way in which victim nets that are safe nets may be identified. For each net being Steiner routed, a set of neighbor nets is selected in step 210. For purposes of ease of discussion, the set of neighbor nets in the following examples is assumed to be those nets with segments adjacent to segments of the potential- victim net under evaluation. The neighbor nets may include, however, nets which are not immediately adjacent to the net under evaluation, as shown in FIG. 3. While such nets will generally have a lesser effect on functional and delay noise on the potential victim net, they may also be considered for purposes of determining whether the net is a victim net, and may also be used as least-noise aggressive neighbor nets as discussed below. Once the'set of neighbor nets has been identified in step 210, a set of worse potential aggressor nets are identified in step 220. In step 230, the maximum total functional and delay noise from the worse aggressor nets is evaluated. If either the functional noise or delay noise is beyond predetermined thresholds, the net is classified as a victim net in response to decision branch 240. If both functional and delay noise are below the predetermined thresholds, then the net is classified as a safe net.

As a person skilled in the art would appreciate, the noise thresholds may be specific, user-specified values for functional and delay noise. Alternatively, a predetermined number or percentage of nets which exhibit the highest maximum functional noise or delay noise may be classified as victim nets. In another embodiment, the noise thresholds may be automatically generated by software.

In a preferred embodiment of step 220, an integer linear programming formulation is utilized wherein constraints and objective functions are generated. Overlap constraints are formulated to ensure that two aggressor nets cannot share the same track segment. For two aggressor nets i and j, which could potentially overlap if routed on the same track segment, $X_i + X_j = 1$, where $X_i = 1$ if net i is routed next to a potential victim net, and $X_i = 0$ if net i is not routed next to a potential victim net. To determine the total functional and delay noise from the worse aggressor nets in step 230, an objective function is formulated as follows:

Let $FN_i$ be the functional noise component when net i is routed next to the potential victim net, and let $DN_i$ be the delay noise component when net i is routed next to the potential victim net. To maximize functional noise, the sum of $FN_i * X_i$ for all i's which are members of the group of aggressor nets is calculated. To maximize delay noise, the sum of $DN_i * X_i$ is calculated for all i's in the group of neighboring aggressor net segments.

FIG. 3 shows a simplified diagram of potential victim net 310 with neighboring aggressor net segment A (320), aggressor net segment B (350), aggressor net segment C (340). and aggressor net segment D (330). Net segments A (320), B (350), and C (340) are all disposed within track K+1 (370), which is adjacent to track K (360), containing potential victim net 310. Net segment D (330) is located track K+2(380), which is located adjacent to track K+1(370) but not immediately adjacent to track K (360). A similar Set of net segments can be routed on the other side of the victim net on tracks K−1, K−2, . . . .

In reference to FIG. 3, let:

$X_A = 1$ when net A is chosen to be placed in a track adjacent to the victim net $X_A = 0$ when net A is not chosen to be placed a track adjacent to the victim net $FN_A$=Functional noise induced on victim net by net A when net segment A is routed next to victim net $DN_A$=Delay noise induced on victim net by net A when net segment A is routed next to victim net The following overlap constraints may be imposed:

$X_D + X_B \leq 1$ $X_C + X_B \leq 1$ $X_A + X_D \leq 1$ $X_D + X_C \leq 1$

By referring to FIG. 3, it is seen that $X_D + X_B \leq 1$ so long as both $X_D$ and $X_B$ are not simultaneously chosen to be placed in the track segment adjacent to the potential victim net segment. These constraints ensure that multiple net segments are not assigned the same segment of the potential victim net for determining the maximum delay and functional noise of the potential victim net.

To determine which nets are to be classified as victim nets, the objective is to determine the maximum noise to which the potential victim net may be subjected. In a preferred embodiment, total functional noise is equivalent to the sum of the noise induced by various neighbor net segments:

$$\Sigma FN_i \cdot X_i,$$

i.e., maximum total functional noise=$FN_A * X_A + FN_B * X_B + FN_C * X_C + FN_D * X_D$.

Similarly, total delay noise is determined by summing the total delay noised induced by all neighbor net segments:

$$\Sigma DN_i \cdot X_i$$

i.e., maximum total delay noise=$DN_A * X_A + DN_B * Y_B + DN_C * Y_C + DN_D * Y_D$ For all potential victim nets for which either the maximum total functional noise or the maximum total delay noise exceed a predetermined threshold, such nets are classified as victim nets and detail routed in accordance with the methodology shown in FIG. 1.

In addition to those potential victim nets classified as victim nets in accordance with the integer linear programming formulation described above, certain nets which are known to be likely problem nets may also be classified as victim nets. For example, nets which comprise long buses are commonly subject to noise problems. A long bus net is one net of a set of long nets that are routed in parallel and connect different parts of a chip. In addition, nets driving latches, registers, other storage elements and dynamic logic, and other high-noise components are also subject to noise problems, and may also be classified as victim nets.

Figure 4:
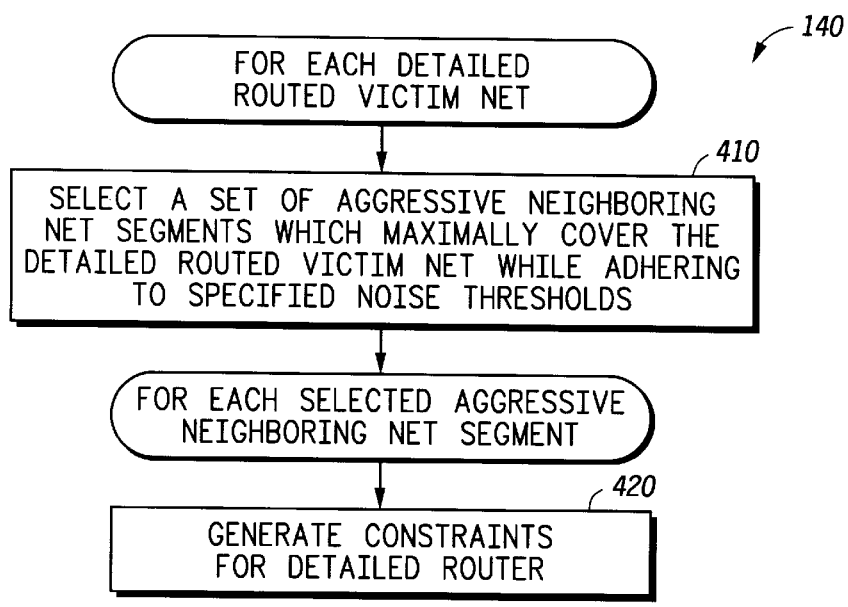
FIG. 4 is a flowchart showing in greater detail the process for identifying least noise-aggressive neighboring nets for routing in tracks adjacent to the victim net.

The flow chart in FIG. 4 shows in greater detail a preferred embodiment of selecting the least noise aggressive neighboring nets and generating constraints per detailed router for each detailed routed net, as shown in step 140 of FIG. 1. It should be understood that while step 140 refers to the "least" noise aggressive neighboring nets, in one embodiment it is not the least noise aggressive neighboring nets but those which have a noise below a predetermined threshold for functional noise and delay noise which are chosen. In other words, it may not be the least noise aggressive neighboring nets which are selected, but instead those which are below specified noise thresholds.

As shown in FIG. 4, for each detailed routed victim net identified in the current iteration. a set of least aggressive neighboring or close proximity net segments which maximally cover the detailed routing victim net while hearing the specified noise thresholds is selected in step 410. Nets are considered to be in close proximity where such nets are adjacent to, or within a few tracks of, the victim net.

One methodology for selecting this set is to use an integer linear programming formulation wherein it is ensured that two aggressor nets cannot share the same track such that the induced noise is less than the functional and delay noise threshold. and to maximize utilization of the neighboring track of the victim net. Routing constraints of the detailed router are generated for the selected aggressive neighboring net segments in step 420. The constraints are fed to the detailed router so that each such selected neighboring net segment is routed.

As stated above, the least noise aggressive neighboring nets may also be identified through integer linear programming methods. It should be understood that the neighboring tracks selected for routing may be those with noise below a specified threshold, and not truly the "least" noise aggressive neighboring nets, depending on the methodology selected for identifying such nets. To ensure that two neighboring nets are not assigned the same track, an overlap constraint may be imposed as follows:

$X_i+X_j \leq 1$, where i and j are two neighboring net segments

To ensure that induced functional noise is below a predetermined threshold, neighboring net segments in which the functional noise induced therein is below a predetermined threshold are selected as follows:

$\Sigma FN_i \cdot X_i \leq$ a predetermined noise threshold (noise margin)

A similar calculation is performed with respect to delay noise:

$\Sigma DN_i \cdot X_i \leq$ a predetermined noise threshold (noise margin)

An objective of this methodology is to maximize the utilization of the tracks adjacent to the victim net, so as to maximally exploit the available routing space on the semiconductor.

Figure 5:
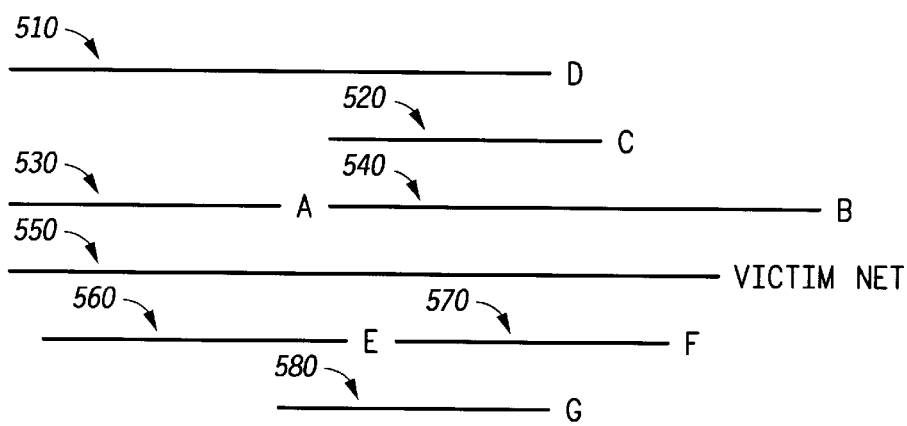
FIG. 5 is an exemplary diagram showing a victim net and neighboring aggressor nets.

An example of the integer linear programming formulation is shown below in connection with FIG. 5. Victim net 550 has aggressive neighboring segments A, B, C, D, E, F and G; 530, 540, 520, 510, 560, 570 and 580, respectively. Adopting the methodology discussed above, least noise aggressive neighboring net segments are selected for tracks adjacent to victim net 550.

Figure 6:
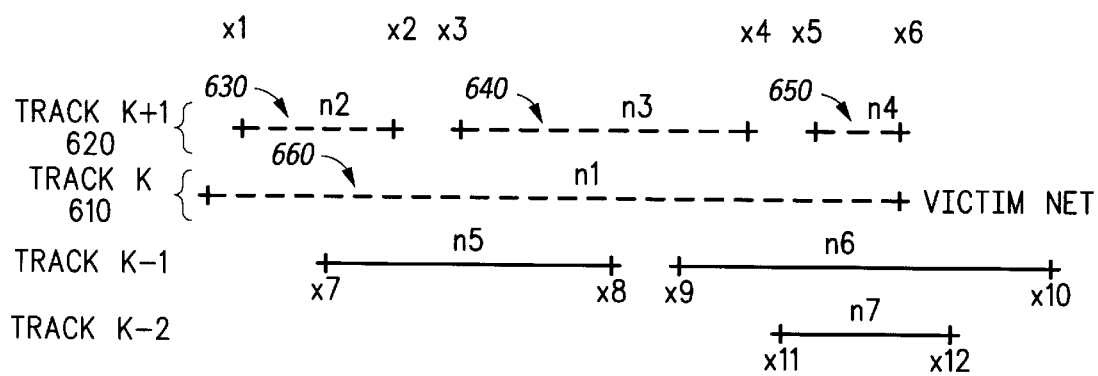
FIG. 6 is an exemplary diagram showing routing constraints for least noise-aggressive neighboring nets relative to a victim net.

Applying integer linear programming, the following overlap constraints may be generated:

$X_D+X_B \leq 1$ $X_C+X_B \leq 1$ $X_A+X_D \leq 1$ $X_D+X_C \leq 1$ $X_E+X_G \leq 1$ $X_F+X_G \leq 1$ $\Sigma FN_i \cdot X_i <$ a predetermined functional noise threshold (noise margin), such that:
$FN_A*X_A+FN_B*X_B*+FN_C*X_C+FN_D*X_D+FN_E*X_E+FN_F*X_F+FN_G*X_G \leq$ a predetermined functional noise threshold Similarly, total delay noise is summed and compared to a predetermined delay noise threshold:

$\Sigma DN_i \cdot X_i \leq$ a predetermined delay noise threshold (slack), such that:
$DN_A*X_A+DN_B*X_B*+DN_C*X_C+DN_D*X_D+DN_E*X_E+DN_F*X_F+DN_G*X_G \leq$ a predetermined delay noise threshold By way of example, constraints for the detailed router may be generated in accordance with FIG. 6. As shown in FIG. 6 victim net n1 (660) is routed on track K (610). Constraints for nets N2, N3 and N4 are generated as follows:

Net n2 (630) is routed on track K+1 (620) from coordinate x1 to x2;

Net n3 (640) is routed on track K+1 (620) from coordinate x3 to x4; and

Net n4 (650) is routed on track K+1 (620) from coordinate x5 to x6.

Upon generation, the constraints are provided to the detailed router, and the nets are detail routed. The method then returns to the Steiner routing phase until all victim nets have been detail-routed.

Skilled artisans would appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required or essential feature or element of any or all the claims. As used herein, the terms "comprises," "comprising," or any other variation thereof, are intended to cover a non-exclusive inclusion. such that a process, method, article, or apparatus that comprises a list of elements does not include only those elements but may include other elements not expressly listed or inherent to such process, method, article, or apparatus.

What is claimed is:

1. A method of providing guidance for routing nets in an integrated circuit model, the method comprising:

performing a first approximate routing of any nets of the integrated circuit model which have not been detail routed;

selecting a first net as a selected net;

selecting a set of neighbor nets within a close proximity to the selected net;

selecting a set of worst aggressor nets which subject the selected net to a greater amount of noise than other sets of aggressor nets, the set of worst aggressor nets and the other sets of aggressor nets being subsets of the set of neighbor nets;

determining a delay noise effect on the selected net due to the set of worst aggressor nets;

classifying the selected net as a victim net of a set of victim nets if the total delay noise effect is greater than a delay noise threshold;

detail routing the victim nets if the set of victim nets is not empty;

after detail routing the victim nets, performing a second approximate routing of any nets that have not been detail routed, with already detail routed nets acting as blockages;

selecting a set of least noise aggressive neighbor nets for each victim net if the set of victim nets is not empty; and providing constraints for detail routing each one of the set of least noise aggressive neighbor nets after selecting the set of least noise aggressive neighbor nets.

2. The method of claim 1 further comprising:

determining if the set of victim nets is empty;

repeating the steps of claim 1 until the set of victim nets is empty; and detail routing all nets that have not been detail routed if the set of victim nets is empty.

3. The method of claim 1 wherein the approximate routing is Steiner routing.

4. The method of claim 1 wherein the detail routing of each one of the set of least noise aggressive neighbor nets includes locating adjacent to a victim net at least a segment of each one of the set of least noise aggressive neighbor nets.

5. The method of claim 1 wherein the detail routing of each one of the set of least noise aggressive neighbor nets includes locating in close proximity to a victim net at least a segment of each one of the set of least noise aggressive neighbor nets.

6. The method of claim 1 further comprising:

selecting a next net as the selected net;

iteratively classifying selected nets as victim nets using the next net as the selected net.

7. The method of claim 1 wherein the set of neighboring nets within the close proximity includes at least one of the group consisting of the following:

nets in a track adjacent to the selected net; and nets in a track adjacent to the selected net and nets in a track second closest to the selected net.

8. The method of claim 1 wherein the noise effect is a functional noise effect; and the threshold is a functional noise threshold.

9. The method of claim 1 further comprising:

classifying the selected net as a victim net if the selected net is a long bus net; and classifying the selected net as a victim net if the selected net is coupled to an input of a storage element.

10. The method of claim 1 wherein integer linear programming is used to select the set of least noise aggressive neighbor nets for each victim net.

11. The method of claim 1 wherein the selecting the set of least noise aggressive neighbor nets for each victim net comprises:

selecting a set of least aggressive neighboring net segments which maximally cover a detail routed victim net from a set of neighbor nets within a close proximity to each net; and generating router constraints for detail routing of the set of least aggressive neighboring net segments.

12. The method of claim 1 further comprising:

extracting a capacitance between neighboring nets after performing each of the first and second approximate routings of the nets of the integrated circuit model which have not been detail routed;

performing a timing analysis on the nets after performing each of the first and second approximate routings of the nets of the integrated circuit model which have not been detail routed; and performing a noise analysis on the nets after performing each of the first and second approximate routings of the nets of the integrated circuit model which have not been detail routed.

13. A method of determining a set of victim nets of an integrated circuit model which are subjected to unacceptable cross talk noise from aggressor nets of the integrated circuit model, the method comprising:

selecting a set of neighbor nets within a close proximity to a selected net;

selecting a set of worst aggressor nets which subject the selected net to a greatest amount of noise, the set of worst aggressor nets being selected from the set of neighbor nets;

determining a delay noise effect on the selected net due to the set of worst aggressor nets; and classifying the selected net as a victim net if the total delay noise effect is greater than a delay noise threshold.

14. The method of claim 13 wherein the selecting the set of worst aggressor nets from the set of neighbor nets comprises an integer linear programming formulation.

15. The method of claim 14 further comprising:

selecting a next net as the selected net; and repeating the steps of claim 13 using the next net as the selected net.

16. The method of claim 14 wherein the set of neighboring nets within the close proximity includes at least one of the group consisting of the following:

nets in a track adjacent to the selected net; and nets in a track adjacent to the selected net and nets in a track second closest to the selected net.

17. The method of claim 14 wherein the noise effect is a functional noise effect; and the threshold is a functional noise threshold.

18. The method of claim 14 further comprising:

classifying the selected net as a victim net if the selected net is a long bus net; and classifying the selected net as a victim net if the selected net is a coupled to an input of a storage element.

* * * * *

UNITED STATES PATENT AND TRADEMARK OFFICE
CERTIFICATE OF CORRECTION

PATENT NO. : 6,480,998 B1  Page 1 of 1
DATED : November 12, 2002
INVENTOR(S) : Pradipto Mukherjee et al.

It is certified that error appears in the above-identified patent and that said Letters Patent is hereby corrected as shown below:

Column 8,
Lines 37, 42, 48 and 53, change "claim 14" to -- claim 13 --

Signed and Sealed this

Twenty-third Day of December, 2003

JAMES E. ROGAN
*Director of the United States Patent and Trademark Office*